United States Patent
Zhang et al.

(10) Patent No.: US 10,784,886 B1
(45) Date of Patent: Sep. 22, 2020

(54) SEGMENTED DIGITAL TO ANALOG CONVERTER

(71) Applicant: NXP USA, Inc., Austin, TX (US)

(72) Inventors: Yizhong Zhang, Suzhou (CN); Stefano Pietri, Austin, TX (US); James Robert Feddeler, Lake Village, IN (US); Michael Todd Berens, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/797,096

(22) Filed: Feb. 21, 2020

(30) Foreign Application Priority Data

Sep. 27, 2019 (CN) .......................... 2019 1 0931505

(51) Int. Cl.
| | | |
|---|---|---|
| H03M 1/66 | (2006.01) | |
| H03M 1/68 | (2006.01) | |
| H03M 1/76 | (2006.01) | |
| H03M 1/78 | (2006.01) | |
| H03M 1/80 | (2006.01) | |
| H03M 1/00 | (2006.01) | |

(52) U.S. Cl.
CPC .......... *H03M 1/687* (2013.01); *H03M 1/765* (2013.01); *H03M 1/785* (2013.01); *H03M 1/00* (2013.01); *H03M 1/66* (2013.01); *H03M 1/80* (2013.01)

(58) Field of Classification Search
CPC ............ H03M 1/66; H03M 1/00; H03M 1/80; H03M 1/785
USPC ................. 341/144, 145, 153, 154, 126, 150
See application file for complete search history.

(56) References Cited

U.S. PATENT DOCUMENTS

| | | |
|---|---|---|
| 3,307,173 A | 2/1967 | Popodi et al. |
| 3,508,249 A | 4/1970 | Gordon |
| 5,119,095 A | 6/1992 | Asazawa |
| 5,627,537 A | 5/1997 | Quinlan et al. |

(Continued)

FOREIGN PATENT DOCUMENTS

| | | |
|---|---|---|
| EP | 2019490 A1 | 1/2009 |
| WO | PCT-WO1996016481 A1 | 5/1996 |
| WO | PCT-WO0213392 A2 | 2/2002 |

OTHER PUBLICATIONS

Xu et al.: "Research of Segmented 8bit Voltage-Mode R-2R Ladder DAC", 2015 IEEE 11th International Conference on ASIC (ASICON), Nov. 3-6, 2015, pp. 1-4.

(Continued)

*Primary Examiner* — Joseph J Lauture

(57) ABSTRACT

A digital to analog converter receives a digital input consisting of first least significant bits, second most significant bits, and third middle significant bits. The digital to analog converter includes first, second, and third sub-DACs. The first sub-DAC receives the first least significant bits, and includes first resistors each contributing a respective voltage, to provide a first output. The second sub-DAC receives the second most significant bits, and includes second resistors each contributing a respective voltage, to provide a second output as an output of the digital to analog converter. The third sub-DAC is connected to the first sub-DAC to receive the first output, and receives the third middle significant bits, and includes third resistors each contributing a respective voltage, to provide a third output to the second sub-DAC. The first and third resistors each has a physical area less than an area of each second resistor.

20 Claims, 3 Drawing Sheets

(56) References Cited

U.S. PATENT DOCUMENTS

| | | | |
|---|---|---|---|
| RE38,083 E | | 4/2003 | Ashe |
| 6,633,246 B1 | | 10/2003 | Bowers |
| 6,975,261 B1 | | 12/2005 | Isham |
| 7,336,211 B1 | | 2/2008 | Lai et al. |
| 8,581,766 B1 | | 11/2013 | Li et al. |
| 8,618,971 B1 | | 12/2013 | Li |
| 9,083,380 B2 | | 7/2015 | Price et al. |
| 9,819,357 B1 | | 11/2017 | Guo et al. |
| 9,991,900 B1 | * | 6/2018 | Kabir ................ H03M 1/66 |
| 10,110,244 B1 | | 10/2018 | Pietri et al. |
| 2006/0092066 A1 | | 5/2006 | Pan |
| 2008/0055135 A1 | | 3/2008 | Li et al. |
| 2008/0186215 A1 | | 8/2008 | Brubaker |
| 2012/0133538 A1 | | 5/2012 | Choi et al. |
| 2013/0222169 A1 | | 8/2013 | Suzuki |
| 2014/0132435 A1 | | 5/2014 | Dempsey |
| 2014/0266835 A1 | | 9/2014 | Price et al. |
| 2016/0056834 A1 | | 2/2016 | Frank |
| 2019/0372586 A1 | | 12/2019 | Zhang et al. |

OTHER PUBLICATIONS

Kester, Walt, "MT-016 Tutorial Basic DAC Architectures III: Segmented DACs", Jan. 1, 2009, pp. 1-6, retrieved from the Internet at http://www.analog.com/media/en/training-seminars/tutorials/MT-016.pdf on Oct. 29, 2015.

* cited by examiner

SEGMENTED DIGITAL TO ANALOG CONVERTER

CROSS-REFERENCE TO RELATED APPLICATIONS

This application claims the priority under 35 U.S.C. § 119 of China application no. 201910931505.2, filed on 27 Sep. 2019, the contents of which are incorporated by reference herein.

BACKGROUND

The present disclosure generally relates to digital-to-analog converters (DACs), and, more particularly, to a segmented Resistive DAC (R-DAC).

Basically, DACs are required to be both monotonic and accurate. Developments on DACs further require high conversion speeds and low power consumptions. FIG. 1 is a schematic diagram of a conventional DAC having three sub-DACs. FIG. 1 is based on FIG. 3 of U.S. Pat. No. 10,110,244, the teachings of which are incorporated herein by reference in its entirety. The DAC 100 of FIG. 1 includes sub-DACs 18, 32, 16, and binary-to-thermometer decoders 12, 30, 14 that are coupled with the respective sub-DACs. The binary-to-thermometer decoders 12, 30, 14 receive a portion of a digital input, D, and provide a thermometer vector T to the corresponding sub-DACs 18, 32, 16, respectively. Each of the sub-DACs 18, 32, and 16 includes an array of resistors, each having a unit resistance of R. A scaling resistor 29 is coupled between the sub-DACs 18 and 32. Between the sub-DACs 32 and 16, another scaling resistor 38 is coupled. Each of the sub-DACs 18, 32, 16 has a corresponding switch bank 22, 34, 20 that couples the resistors in the arrays to a high reference voltage $V_{refh}$ or a low reference voltage $V_{refl}$. The sub-DAC 18 further includes a termination resistor 24 having the unit resistance of R.

The resistors of the DAC of FIG. 1 have the same resistance that is easy to configure, and avoids mismatching among the sub-DACs. However, the resistors with the same resistance consume a relatively large area. Typically, the DAC implemented on an SoC (system on chip) has a matrix size of around 240,000 $\mu m^2$.

It would be advantageous to have a DAC which has an efficient layout area while keeping accurate and monotonic.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, the present invention provides a digital to analog converter which receives a binary coded digital input and converts the digital input into an analog signal. The binary coded digital input consists of most significant bits, least significant bits, and remaining bits. The digital to analog converter includes a first, a second, and a third binary-to-thermometer decoders, and a first, a second, and a third sub-DACs. The first binary-to-thermometer decoder receives the least significant bits and decodes the least significant bits into first thermometer code bits. The second binary-to-thermometer decoder receives the most significant bits and decodes the most significant bits into second thermometer code bits. The third binary-to-thermometer decoder receives the remaining bits and decodes the remaining bits into third thermometer code bits. The first sub-DAC includes multiple first resistors and multiple first switches each connected to a respective first resistor. Each of the first resistors has a common first resistance. Each of the first switches receives a respective bit of the first thermometer code bits, and is controlled by the respective bit to connect the respective first resistor to a high reference voltage or a low reference voltage. The second sub-DAC includes multiple second resistors and multiple second switches each connected to a respective second resistor. Each of the second resistors has a common second resistance. Each of the second switches receives a respective bit of the second thermometer code bits, and is controlled by the respective bit to connect the respective second resistor to the high reference voltage or the low reference voltage. The third sub-DAC includes multiple third resistors and multiple third switches each connected to a respective third resistor. Each of the third resistors has a common third resistance. Each of the third switches receives a respective bit of the third thermometer code bits, and is controlled by the respective bit to connect the respective third resistor to the high reference voltage or the low reference voltage. The first and third resistances are lower than the second resistance.

In another embodiment, the present invention provides a digital to analog converter which converts a digital input into an analog output. The digital input consists of first least significant bits, second most significant bits, and third middle significant bits. The digital to analog converter includes a first, a second, and at least a third sub-DACs. The first sub-DAC receives the first least significant bits by way of a first binary-to-thermometer decoder, and includes first resistors each contributing a respective voltage, to provide a first output as a response. The second sub-DAC receives the second most significant bits by way of a second binary-to-thermometer decoder, and includes second resistors each contributing a respective voltage, to provide a second output as an output of the digital to analog converter. The third sub-DAC is connected to the first sub-DAC to receive the first output, and receives the third middle significant bits by way of a third binary-to-thermometer decoder, and includes third resistors each contributing a respective voltage, to provide a third output to the second sub-DAC. The first and third resistors each has a physical area less than an area of each second resistor.

BRIEF DESCRIPTION OF THE DRAWINGS

So that the manner in which the above recited features of the present disclosure can be understood in detail, a more detailed description is given below, with reference to embodiments, some of which are illustrated in the appended drawings. The appended drawings illustrate only typical embodiments of the disclosure and should not be interpreted as limiting the scope of the disclosure, as the disclosure may have other embodiments, which may be equally effective. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
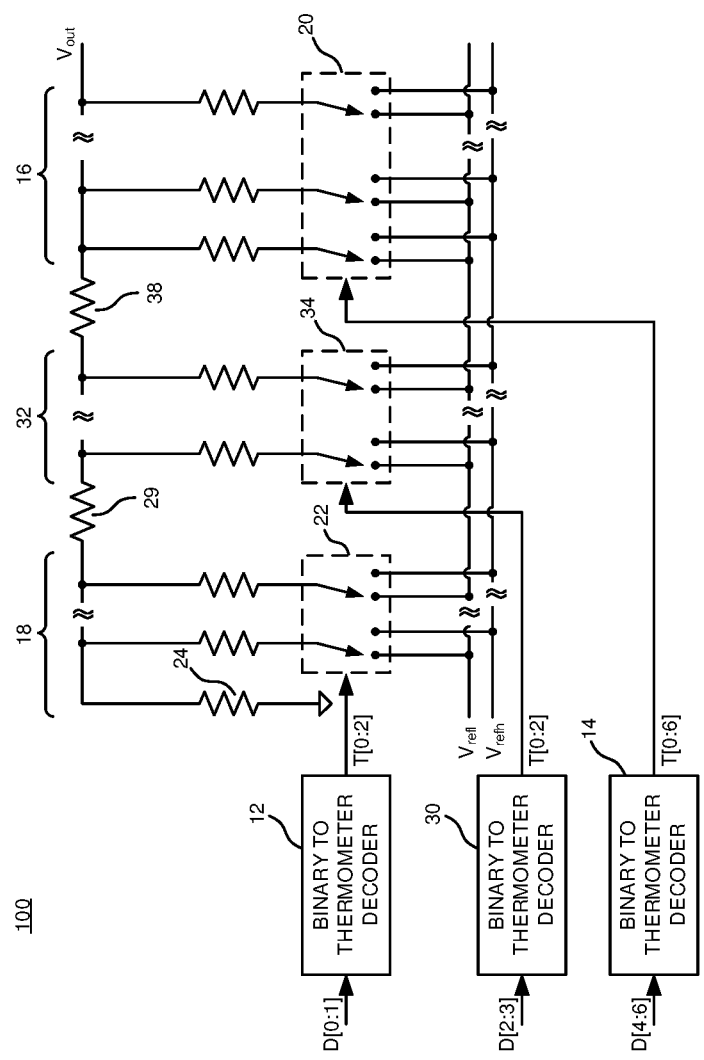
FIG. 1 is a schematic diagram of a conventional DAC having three sub-DACs.
Figure 2:
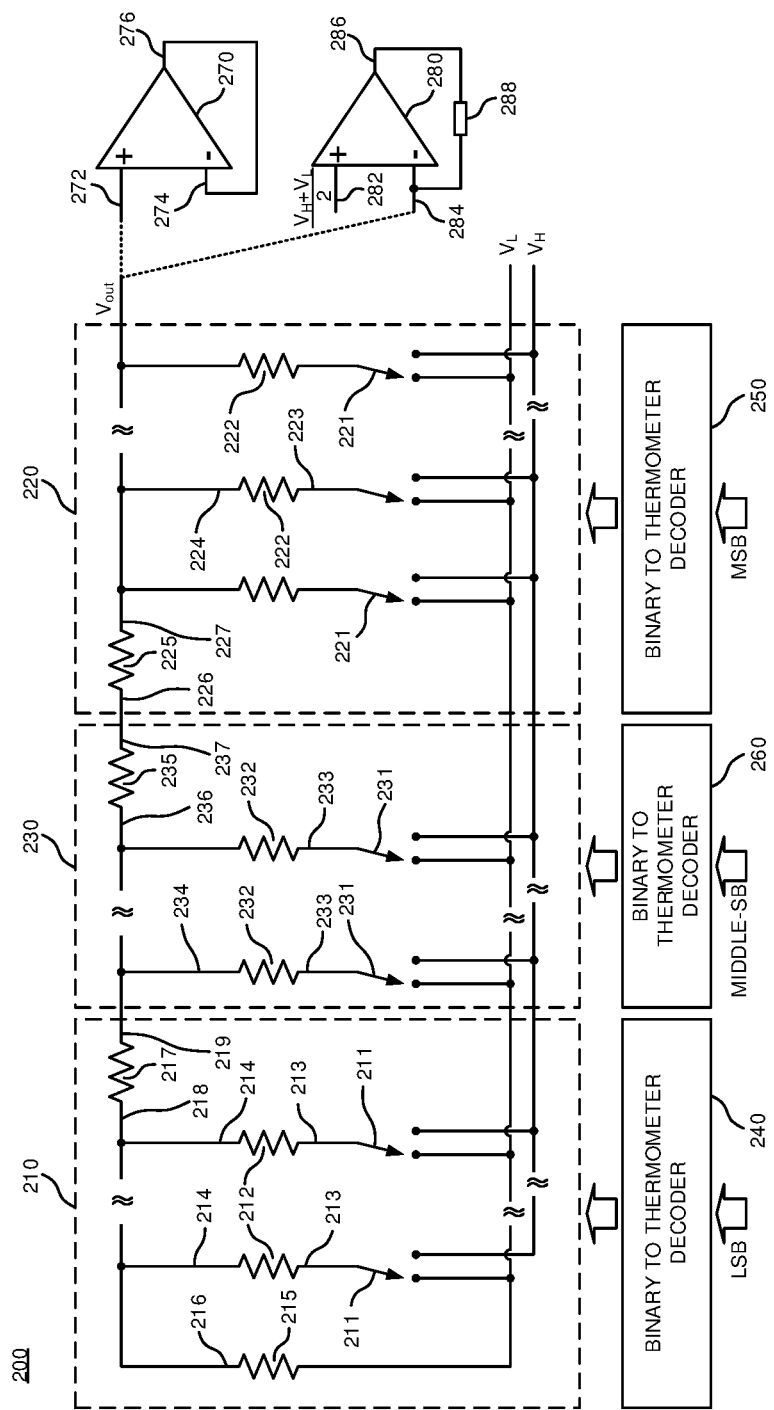
FIG. 2 is a schematic diagram of a digital-to-analog converter (DAC) in accordance with an embodiment.

FIG. 2 shows a schematic diagram of a digital-to-analog converter (DAC) in accordance with an embodiment of the present disclosure. The DAC 200 includes a first sub-DAC 210, a second sub-DAC 220, and a third sub-DAC 230, wherein the third sub-DAC 230 is connected between the first sub-DAC 210 and the second sub-DAC 220. The DAC 200 receives a digital input of binary codes, and converts the digital input into an analog output voltage $V_{out}$. As depicted in FIG. 2, the DAC 200 includes first, second, and third binary-to-thermometer decoders 240, 250, and 260. Each binary-to-thermometer decoder corresponds to a sub-DAC, the function of which is to control the switches using thermometer bits decoded from the binary bits, so as to couple resistors of the sub-DACs to either a high reference voltage $V_H$ or a low reference voltage $V_L$, in a similar way to that depicted in FIG. 1.

According to the present embodiment, the first binary-to-thermometer decoder 240 receives first least significant bits (LSBs) of the digital input, and converts these first LSBs into thermometer bits that are further provided to the first sub-DAC 210. It is understood that, a value of the digital input binary bits received by the binary-to-thermometer decoder corresponds to a quantity of bit "1" in the thermometer codes provided by converting those digital input bits. For example, if the binary value is a 2-bit value, the decoder will convert the 2-bit digital input into a 3-bit thermometer code vector, and if the input binary value is a 3-bit value, the thermometer code vector would be 7 bits. For example, if the binary input is "00", then the converted thermometer code vector would be "000". Similarly, a binary input of "01" would provide a thermometer code vector as "100", a binary input of "10" would provide a thermometer code vector as "110", and a binary input of "11" would provide a thermometer code vector as "111". If the binary input is "001", then the thermometer code vector is "1000000", and if the binary input is "100", then the thermometer code vector is "1111000", and if the binary input is "110", then the thermometer code vector is "1111110". That is, the binary-to-thermometer decoder receives a digital input data in binary format and provide vector bits with the number of vector bits set to 1 equal to the digital input data starting at bit 0.

In the embodiment, the first LSBs of the digital input received by the first binary-to-thermometer decoder 240 are converted into a thermometer code vector which is then provided to the first sub-DAC 210. Similarly, the second binary-to-thermometer decoder 250 receives binary coded second most significant bits (MSBs) of the digital input, and the third binary-to-thermometer decoder 260 receives binary coded third middle significant bits (middle-SBs) of the digital input. It is hereby easily understood that, the LSBs, the middle-SBs, and the MSBs of the digital input are different from each other, and collectively consist the digital input. Accordingly, when the LSBs and the MSBs are determined, the middle-SBs are the remaining bits of the digital input that are to be provided to at least one sub-DAC other than the first and second binary-to-thermometer decoders 240 and 250. Correspondingly, the first sub-DAC 210 includes first switches 211 each receiving a bit of the thermometer code vector provided by the first binary-to-thermometer decoder 240, the second sub-DAC 220 includes second switches 221 each receiving a bit of the thermometer code vector provided by the second binary-to-thermometer decoder 250, and the third sub-DAC 230 includes third switches 231 each receiving a bit of the thermometer code vector provided by the third binary-to-thermometer decoder 260.

The first sub-DAC 210 includes first resistors 212 each having a first terminal 213 and a second terminal 214. The first terminals 213 of the first resistors 212 each connects to a corresponding first switch 211. The first switches 211 thereby connects the first resistors 212 to the high reference voltage $V_H$ or the low reference voltage $V_L$, according to and under control of the applying bit of the thermometer code vector provided by the first binary-to-thermometer decoder 240. In this way, the first resistors 212 each contributes a respective voltage to a first output voltage of the first sub-DAC 210. The first sub-DAC 210 further includes a termination resistor 215 having a first terminal 216 connecting to the second terminals 214 of the first resistors 212. The other terminal of the termination resistor 215 connects to the low reference voltage $V_L$. The first sub-DAC 210 includes a first scaling resistor 217 having a first terminal 218 connecting to the second terminals 214 of the first resistors 212, and a second terminal 219 providing the first output voltage of the first sub-DAC 210.

Similarly, the third sub-DAC 230 includes third resistors 232 each having a first terminal 233 and a second terminal 234. The first terminals 233 of the third resistor 232 each connects to a corresponding third switch 231. The third switches 231 thereby connects the third resistors 232 to the high reference voltage $V_H$ or the low reference voltage $V_L$, according to and controlled by the applying bit of the thermometer code vector provided by the third binary-to-thermometer decoder 260. In this way, the third resistors 232 each contributes a respective voltage to a third output voltage of the third sub-DAC 230. The third sub-DAC 230 further includes a third scaling resistor 235 having a first terminal 236 connecting to the second terminals 234 of the third resistors 232, and a second terminal 237 providing the third output voltage of the third sub-DAC 230.

Similarly, the second sub-DAC 220 includes second resistors 222 each having a first terminal 223 and a second terminal 224. The first terminals 223 of the second resistor 222 each connects to a corresponding second switch 221. The second switches 221 thereby connects the second resistors 222 to the high reference voltage $V_H$ or the low reference voltage $V_L$, according to and under control of the applying bit of the thermometer code vector provided by the second binary-to-thermometer decoder 250. In this way, the second resistors 222 each contributes a respective voltage to a second output voltage of the second sub-DAC 220. The second sub-DAC 220 further includes a second scaling resistor 225 having a first terminal 226 connecting to the third sub-DAC 230, and a second terminal 227 connected to the second terminals 224 of the second resistors 222, to provide the second output voltage of the second sub-DAC 220.

According to the present embodiment, the termination resistor 215 has a resistance $2R_L$ equal to the resistance $2R_L$ of each of the first and third resistors 212 and 232. If the first binary-to-thermometer decoder 240 receives a 4-bit binary code of the digital input, and the third binary-to-thermometer decoder 260 also receives a 4-bit binary code of the digital input, the first and third scaling resistors 217 and 235 each has a resistance which is 15/16 of the resistance of each of the first and third resistors 212 and 232, which is $$\frac{15}{16} \times 2R_L,$$

so that an equivalent resistance of the first sub-DAC 210 seen from the third sub-DAC 230 equals to $2R_L$, and an equivalent resistance of the third sub-DAC 230 seen from the second sub-DAC 220 also equals to $2R_L$. On the other hand, the second resistors 222 each has a resistance of $2R_M$ which is proportional to the resistance $2R_L$ of each of the first and third resistors 212 and 232, depending upon an equation $2R_M=\alpha \times 2R_L$, for which $\alpha$ will be described later. The second scaling resistor 225 has a resistance of $2R_M$-$2R_M$, which is a difference between resistances of the first resistors 212 and the second resistors 222.

Figure 3:
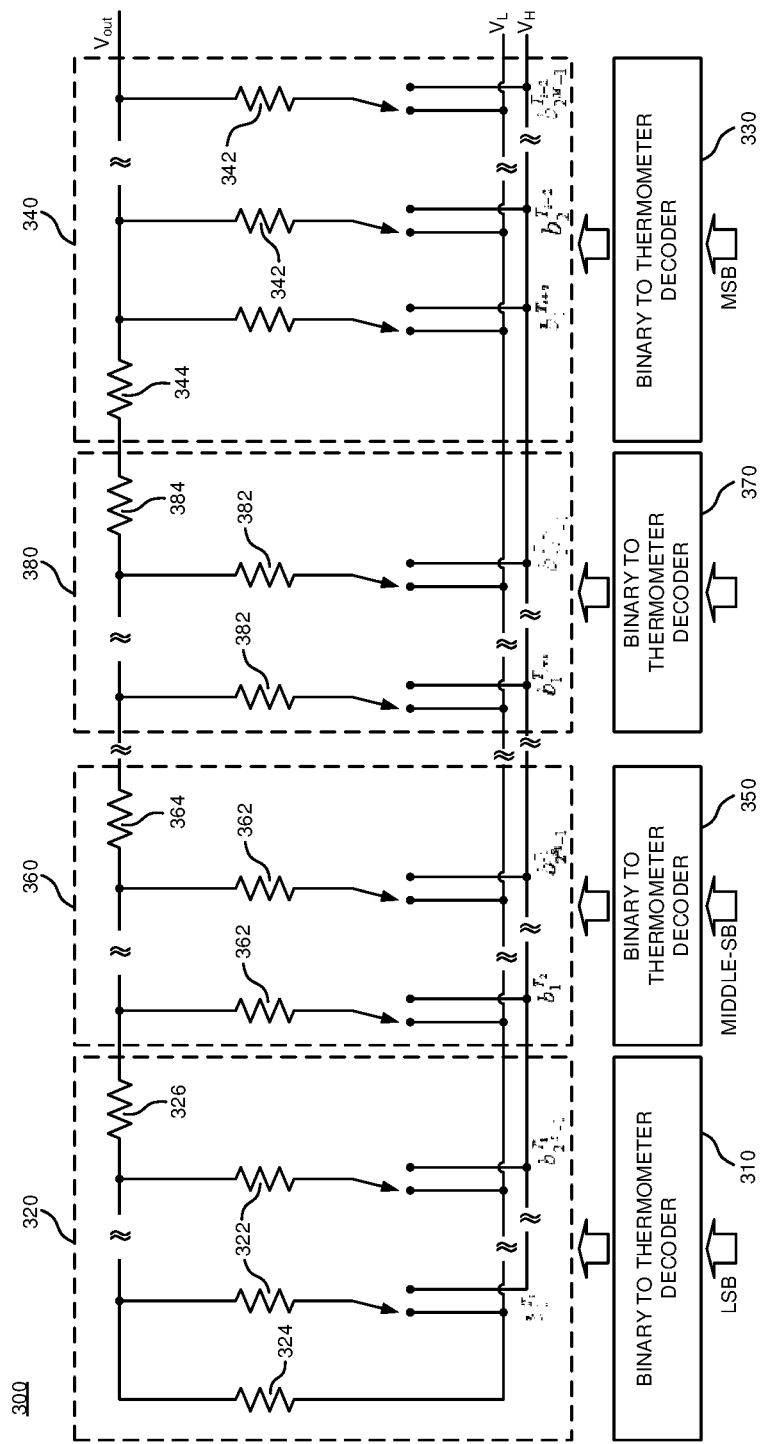
FIG. 3 is a schematic diagram depicting a more general segmented DAC according to an embodiment.

It is mentioned herein that, the DAC 200 readily includes the first sub-DAC 210 to receive the LSBs of the digital input, and the second sub-DAC 220 to receive the MSBs of the digital input. Although it is depicted in FIG. 2 that the DAC 200 includes the third sub-DAC 230 to receive the middle-SBs of the digital input, in alternative embodiments, the DAC 200 can include more sub-DACs that are similar to the third sub-DAC 230 for which the number of switches and corresponding resistors are configurable to reflect the received bits of the digital input. FIG. 3 is a schematic diagram depicting part of a more general segmented DAC according to an embodiment of the present invention. The DAC 300 includes a first binary-to-thermometer decoder 310 which receives L-bit first LSBs of a digital input and converts the L-bit first LSBs into a first thermometer code vector $T_1$ of $2^L-1$ bits. Correspondingly, the DAC 300 includes a first sub-DAC 320 connected to the first binary-to-thermometer decoder 310 to receive the bits of the first thermometer code vector $T_1$, namely $b_1^{T_1}$ to $b_{2^L-1}^{T_1}$. Besides, the DAC 300 includes a second binary-to-thermometer decoder 330 which receives M-bit second MSBs of the digital input and converts the M-bit second MSBs into a second thermometer code vector $T_{i+2}$ of $2^M-1$ bits. Correspondingly, the DAC 300 includes a second sub-DAC 340 connected to the second binary-to thermometer decoder 330 to receive the bits of the second thermometer code vector $T_{i+2}$, namely $b_1^{T_{i+2}}$ to $b_{2^M-1}^{T_{i+2}}$. Similar to the first sub-DAC 210 of FIG. 2, first resistors 322 of the first sub-DAC 320 have resistances of $2R_L$, and the termination resistor 324 of the first sub-DAC 320 also has a resistance of $2R_L$. A first scaling resistor 326 of the first sub-DAC 320 has a resistance of $$\frac{2^L-1}{2^L} \times 2R_L.$$

similar to the second sub-DAC 220 of FIG. 2, second resistors 342 of the second sub-DAC 340 have resistances of $2R_M$, where an equation $2R_M=\alpha \times 2R_L$ applies, and for which $\alpha$ will be described later. A second scaling resistor 344 of the second sub-DAC 340 also has a resistance of $2R_M$-$2R_L$, which is similar to the second scaling resistor 225 of the second sub-DAC 220 of FIG. 2.

As depicted in FIG. 3, the DAC 300 includes a third binary-to-thermometer decoders 350 and a fourth binary-to-thermometer decoder 370 that collectively receive third middle-SBs that are the remaining bits other than the first LSBs and the second MSBs of the digital input. The third and fourth sub-DACs 360 and 380 respectively connect to the third and fourth binary-to-thermometer decoders 350 and 370. The third binary-to-thermometer decoder 350 is configured to receive $S_1$ bits of the third middle significant bits of the digital input, and to decode the received $S_1$-bit binary code into a third thermometer code vector $T_2$ of $2^{S_1}-1$ bits, namely $b_1^{T_2}$ to $b_{2^{S_1}-1}^{T_2}$, each being provided to a corresponding third switch of the third sub-DAC 360. Similar to the third sub-DAC 230 of FIG. 2, third resistors 362 of the third sub-DAC 360 have resistances of $2R_L$, and third scaling resistor 364 of the third sub-DAC 360 has a resistance of $$\frac{2^{S_1}-1}{2^{S_1}} \times 2R_L.$$

The fourth binary-to-thermometer decoder 370 is configured to receive $S_i$ middle significant bits of the digital input, and to decode the received $S_i$ binary coded bits into $2^{S_i}-1$ bits of thermometer code vector $T_{i+1}$, namely $b_1^{T_{i+1}}$ to $b_{2^{S_i}-1}^{T_2}$, each being provided to a corresponding switch of the fourth sub-DAC 380. Similar to the third sub-DAC 230 of FIG. 2 and the third sub-DAC 360, fourth resistors 382 of the fourth sub-DAC 380 have resistances of $2R_L$, and fourth scaling resistor 384 of the fourth sub-DAC 380 has a resistance of $$\frac{2^{S_i}-1}{2^{S_i}} \times 2R_L.$$

To keep the DAC monotonic, resistances of the resistors should be kept stable, to enable a one-bit change in the digital input to be correctly transferred into the output voltage. Resistor mismatch reflects the resistance stability of the resistor, and the deviation of the resistance from the designed resistance. For example, the resistors of a DAC receiving 4 bits of binary code input should have the mismatches less than $1/2^4$ so that a one-bit change in the input can be correctly transferred into the output voltage. Each additional bit of accuracy requirement translates into a mismatch requirement which is narrowed by half, which means that the resistor mismatch should be lowered by half.

In fabricating the DAC, the resistors are fabricated integrally with the others of the device, that is to say they are "on chip" rather than discrete components, and occupy space on the integrated circuit (IC) chip. The physical area that a resistor occupies has an inverse relationship to the mismatch of the resistor. Specifically, the mismatch is inversely proportional to the square root of the area:

$$\delta R = \frac{1}{\sqrt{Area\_R}} \times k,$$

wherein Area_R is the physical area that the resistor consumes, k is a sloping factor, and $\delta R$ is the mismatch of the resistor. A higher resistor mismatch allows the resistor area to be saved. According to what is described above, lowering the monotonic requirement by one bit can reduce the resistor area requirement by a factor of 4, to as little as ¼ the original area. Referring back to the embodiment of FIG. 2, in the case that the first sub-DAC 210 and the third sub-DAC 230 respectively each receive 4 bits of the digital input, the second sub-DAC 220 is required to have an accuracy which is at least 4-bit+4-bit, that is to say an accuracy of at least 8-bits, to ensure that the second sub-DAC 220 is correctly operated with a one-bit turn-over of the 8 bits input into the first sub-DAC 210 and the third sub-DAC 230. Preferably, in some embodiments, the second sub-DAC 220 has an accuracy of 9-bit, that is to say it includes one more bit as a design margin. However, for the third sub-DAC 230, an accuracy of—at most—only 5 bits is required. The area of the third resistors 232 is configured as $$\text{Area\_2}R_L = \frac{\text{Area\_2}R_M}{4^{9-5}} = \frac{\text{Area\_2}R_M}{256},$$

wherein Area_2$R_M$ is the area of the second resistors 222 of the second sub-DAC 220. The first resistors 212 and the termination resistor 215 of the first sub-DAC 210 can have the same configuration as the third resistors 232 of the third sub-DAC 230, which saves the areas of the resistors in the first and third sub-DACs 210 and 230 to be only 1/256 of the areas of the second resistors 222 in the second sub-DAC 220.

To be more general, referring to FIG. 3, the area of each of the first resistors 322, the third resistors 362, and the fourth resistors 382 is $$\frac{1}{4^{S_1+S_i}}$$

of the area of each second resistors 342, wherein $S_1$ is at least 1. Accordingly, the resistance of each of the first resistors 322, the third resistors 362, and the fourth resistors 382 is less than that of the resistance of each second resistors 342. In the embodiment where the resistance of resistors is dominantly determined by the area the resistors occupy, the factor $\alpha$ in the above equation $2R_M=\alpha\times2R_L$ is at least 4. However, other fraction ratios are applicable, such as a is preferably between 2 and 8, which can both save the resistor area in the sub-DACs receiving the LSB and middle-SB and ensure the accuracy.

Referring back to FIG. 2, the DAC 200 may further include an operational amplifier (op-amp) 270 having a non-inverting input terminal 272 connected to the output of the second sub-DAC 220 and an inverting input terminal 274 connected to an output terminal 276 of the operational amplifier 270. The DAC 200 includes the op-amp 270 to operate as an unbuffered voltage mode DAC. In other embodiments, the DAC 200 includes an alternative operational amplifier 280 instead of the op-amp 270. The op-amp 280 has a non-inverting input terminal 282 connected to a reference voltage which is an average of the high reference voltage $V_H$ and the low reference voltage $V_L$, an inverting input terminal 284 which is connected to the output of the second sub-DAC 220, and an output terminal 286 connected to the inverting input terminal 284 by way of a feedback resistor 288. The feedback resistor 288 has, in this case, a resistance of $$\frac{1}{64}\times 2R_M,$$

wherein 64 is $2^6$, 6 being the number of bits of the MSBs provided to the second sub-DAC 220, and $2R_M$ is the resistance of the second resistors 222 of the second sub-DAC 220. The DAC 200 includes the alternative op-amp 280 to operate as a buffered voltage mode DAC. In FIG. 2, dashed lines between third sub-DAC 230 and the op-amps 270 and 280 show possible connections.

The DAC as described in the embodiments includes a first sub-DAC to receive a thermometer code vector converted from the LSBs of the digital input, and a second sub-DAC to receive a thermometer code vector converted from the MSBs of the digital input. Further, the DAC includes at least a third sub-DAC connecting between the first and second sub-DACs to receive a thermometer code vector converted from the middle-SBs of the digital input. Each of the first to third sub-DACs includes multiple switches receiving corresponding bits of the respectively received thermometer code vector. Each of the first to third sub-DACs further includes multiple resistors each connected to a corresponding switch. The switches are controlled by the bits of the thermometer code vectors to connect the corresponding resistors to a high reference voltage or a low reference voltage. Each resistor in the first sub-DAC and the third sub-DAC has a resistance which is less than that of the resistor in the second sub-DAC. Accordingly, the resistors in the first sub-DAC and third sub-DAC consume reduced area, while keep the DAC monotonic and accurate.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A digital to analog converter configured to receive a binary coded digital input and convert the digital input into an analog signal, the binary coded digital input consisting of most significant bits, least significant bits, and remaining bits, wherein the digital to analog converter comprises:
   a first binary-to-thermometer decoder configured to receive the least significant bits and decode the least significant bits into first thermometer code bits;
   a second binary-to-thermometer decoder configured to receive the most significant bits and decode the most significant bits into second thermometer code bits;
   a third binary-to-thermometer decoder configured to receive at least some of the remaining bits and decode the remaining bits into third thermometer code bits;
   a first sub-DAC comprising multiple first resistors and multiple first switches each connected to a respective first resistor, wherein each of the first resistors has a common first resistance, and each of the first switches is configured to receive a respective bit of the first thermometer code bits, and to be controlled by the respective bit to connect the respective first resistor to a high reference voltage or a low reference voltage;
   a second sub-DAC comprising multiple second resistors and multiple second switches each connected to a respective second resistor, wherein each of the second resistors has a common second resistance, and each of the second switches is configured to receive a respective bit of the second thermometer code bits, and to be controlled by the respective bit to connect the respective second resistor to the high reference voltage or the low reference voltage; and
   a third sub-DAC comprising multiple third resistors and multiple third switches each connected to a respective third resistor, wherein each of the third resistors has a common third resistance, and each of the third switches is configured to receive a respective bit of the third thermometer code bits, and to be controlled by the respective bit to connect the respective third resistor to the high reference voltage or the low reference voltage;
   wherein the first and third resistances are lower than the second resistance.

2. The digital to analog converter of claim 1, wherein
   each first resistor has a first terminal connected to the respective first switch, and a second terminal connected together; and
   the first sub-DAC further comprises a first scaling resistor having a first terminal connected to the second terminals of the first resistors, and a second terminal providing an output of the first sub-DAC.

3. The digital to analog converter of claim 2, wherein a resistance of the first scaling resistor is $(2^L-1)/2^L$ of the first resistance, wherein L is the number of least significant bits of the digital input received by the first binary-to-thermometer decoder.

4. The digital to analog converter of claim 2, wherein
   the first sub-DAC further comprises a termination resistor having a first terminal connecting to the low reference voltage, and a second terminal connected to the second terminals of the first resistors; and
   a resistance of the termination resistor equals the first resistance.

5. The digital to analog converter of claim 1, wherein
   each third resistor has a first terminal connecting to the respective third switch, and a second terminal connected together to an output of the first sub-DAC; and
   the third sub-DAC further comprises a third scaling resistor having a first terminal connected to the second terminals of the third resistors, and a second terminal providing an output of the third sub-DAC.

6. The digital to analog converter of claim 5, wherein a resistance of the third scaling resistor is $(2^{S1}-1)/2^{S1}$ of the third resistance, wherein S1 is the number of the remaining bits of the digital input received by the third binary-to-thermometer decoder.

7. The digital to analog converter of claim 1, wherein
   each second resistor has a first terminal connecting to the respective second switch, and a second terminal connected together to provide an output of the second sub-DAC; and
   the second sub-DAC further comprises a second scaling resistor having a first terminal connected to an output of the third sub-DAC, and a second terminal connected to the second terminals of the second resistors.

8. The digital to analog converter of claim 7, wherein a resistance of the second scaling resistor is a difference between the first and the second resistances.

9. The digital to analog converter of claim 1, wherein the third binary-to-thermometer decoder is configured to receive to receive all of the remaining bits.

10. The digital to analog converter of claim 1, further comprising:
    a fourth binary-to-thermometer decoder, wherein the third and the fourth binary-to-thermometer decoders collectively receive all the remaining bits, and collectively decode the remaining bits into the third thermometer code bits; and
    a fourth sub-DAC comprising multiple fourth resistors and multiple fourth switches each connected to a respective fourth resistor, wherein each of the fourth resistor has a common fourth resistance, and each of the fourth switches is configured to receive a respective bit of the third thermometer code bits from the fourth binary-to-thermometer decoder, and to be controlled by the respective bit to connect the respective fourth resistor to the high reference voltage or the low reference voltage.

11. The digital to analog converter of claim 10, wherein
    the first sub-DAC is configured to provide a first output voltage in response to the first thermometer code bits;
    the third sub-DAC is configured to receive the first output voltage, and provide a third output voltage in response to the received third thermometer code bits from the third binary-to-thermometer decoder;
    the fourth sub-DAC is configured to receive the third output voltage, and provide a fourth output voltage in response to the third thermometer code bits from the fourth binary-to-thermometer decoder; and
    the second sub-DAC is configured to receive the fourth output voltage, and provide a second output voltage as an output of the digital to analog converter.

12. The digital to analog converter of claim 11, wherein
    each fourth resistor has a first terminal connected to the respective fourth switch, and a second terminal connected together;
    the fourth sub-DAC further comprises a fourth scaling resistor having a first terminal connected to the second terminals of the fourth resistors, and a second terminal providing the fourth output voltage.

13. The digital to analog converter of claim 12, wherein a resistance of the fourth scaling resistor is $(2^{Si}-1)/2^{Si}$ of the fourth resistance, wherein Si is the number of the remaining bits of the digital input received by the fourth binary-to-thermometer decoder.

14. The digital to analog converter of claim 10, wherein the fourth resistance equals the third resistance.

15. The digital to analog converter of claim 1, wherein the third resistance is between ½ and ⅛ of the second resistance.

16. A digital to analog converter configured to convert a digital input consisting of first least significant bits, second most significant bits, and third middle significant bits into an analog output, wherein the digital to analog converter comprises:
   a first sub-DAC configured to receive the first least significant bits by way of a first binary-to-thermometer decoder, and comprising first resistors each contributing a respective voltage, to provide a first output as a response;
   a second sub-DAC configured to receive the second most significant bits by way of a second binary-to-thermometer decoder, and comprising second resistors each contributing a respective voltage, to provide a second output as an output of the digital to analog converter; and
   a third sub-DAC connected to the first sub-DAC to receive the first output, and configured to receive the third middle significant bits by way of a third binary-to-thermometer decoder, and comprising third resistors each contributing a respective voltage, to provide a third output to the second sub-DAC; wherein
   the first and third resistors each has a physical area less than an area of each second resistor.

17. The digital to analog converter of claim 16, wherein each of the first resistors and each of the third resistors has a resistance which is less than a resistance of each second resistor.

18. The digital to analog converter of claim 17, wherein the resistance of each of the first and third resistors is between ½ and ⅛ of the resistance of each second resistor.

19. The digital to analog converter of claim 16, wherein:
   the first sub-DAC comprises first switches each connected to a respective first resistor, and is configured to connect the respective first resistor to a high reference voltage or a low reference voltage in response to a bit of a first thermometer code vector decoded from the first least significant bits by the first binary-to-thermometer decoder;
   the second sub-DAC comprises second switches each connected to a respective second resistor, and is configured to connect the respective second resistor to the high reference voltage or the low reference voltage in response to a bit of a second thermometer code vector decoded from the second most significant bits by the second binary-to-thermometer decoder; and
   the third sub-DAC comprises third switches each connected to a respective third resistor, and is configured to connect the respective third resistor to the high reference voltage or the low reference voltage in response to a bit of a third thermometer code vector decoded from the third middle significant bits by the third binary-to-thermometer decoder.

20. The digital to analog converter of claim 16, further comprising a fourth sub-DAC connected to the third sub-DAC to receive the third output, and connected to the second sub-DAC to provide a fourth output to the second sub-DAC; wherein
   the third sub-DAC and the fourth sub-DAC are configured to collectively receive the third middle significant bits respectively by way of the third binary-to-thermometer decoder and a fourth binary-to-thermometer decoder;
   the fourth sub-DAC comprises fourth resistors each contributing a respective voltage, to provide the fourth output; and
   each of the fourth resistors has a resistance which equals to the resistance of each third resistor.

\* \* \* \* \*